United States Patent [19]
Mar

[11] Patent Number: 6,114,914
[45] Date of Patent: Sep. 5, 2000

[54] FRACTIONAL SYNTHESIS SCHEME FOR GENERATING PERIODIC SIGNALS

[75] Inventor: Monte F. Mar, Issaquah, Wash.

[73] Assignee: Cypress Semiconductor Corp., San Jose, Calif.

[21] Appl. No.: 09/314,535

[22] Filed: May 19, 1999

[51] Int. Cl.[7] .............................. H03K 21/00; H03L 7/18
[52] U.S. Cl. ................................ 331/16; 331/18; 331/74; 331/57; 327/115; 327/156
[58] Field of Search ................................ 331/1 A, 16, 18, 331/25, 45, 57, 74; 327/114–116, 156–159

[56] References Cited

U.S. PATENT DOCUMENTS

| | | | |
|---|---|---|---|
| 5,684,434 | 11/1997 | Mann et al. | 331/16 |
| 5,745,011 | 4/1998 | Scott | 331/44 |
| 5,767,706 | 6/1998 | Vehara | 327/113 |
| 5,805,003 | 9/1998 | Hsu | 327/270 |
| 5,877,656 | 3/1999 | Mann et al. | 331/16 |
| 5,970,110 | 10/1999 | Li | 377/48 |

OTHER PUBLICATIONS

Eric Mann, U.S.S.N. 08/995,485, Crystal Oscillator With EPROM–Controlled Frequency Trim, filed Dec. 22, 1997.

Paul H. Scott, U.S.S.N. 09/047,595, Roving Range Control to Limit Receive PLL Frequency Of Operation, filed Mar. 25, 1998.

Michael L. Duffy et al., U.S.S.N. 09/086,124, Circuit, Architecture and Method(s) of Controlling a Periodic Signal Generating Circuit or Device, filed May 28, 1998.

Galen Stansell et al., U.S.S.N. 09/246,981, Clock Generator With Programmable Two–Tone Modulation for EMI Reduction, filed Feb. 9, 1999.

Nathan Y. Moyal et al., U.S.S.N. 09/159,908, Circuits, Architectures and Methods for Detecting and Correcting Excess Oscillator Frequencies, filed Sep. 24, 1998.

Monte F. Mar, U.S.S.N. 09/207,912, Circuits, Architecture and Method for Operating and/or Tuning a Ring Oscillator, filed Dec. 9, 1998.

Monte F. Mar et al., U.S.S.N. 09/275,336, Programmable Oscillator Scheme, filed Mar. 24, 1999.

*Primary Examiner*—David Mis
*Attorney, Agent, or Firm*—Christopher P. Maiorana, P.C.

[57] ABSTRACT

An apparatus comprising a first circuit, a second circuit and a third circuit. The first circuit may be configured to generate an output signal having a first frequency in response to (i) an input having a second frequency and (ii) a first control signal. The second circuit may be configured to generate the second frequency in response to (i) a plurality of third clock signals and (ii) a second control signal. The third circuit may be configured to present the first and second control signals in response to one of said plurality of third clock signals.

14 Claims, 3 Drawing Sheets

FRACTIONAL SYNTHESIS SCHEME FOR GENERATING PERIODIC SIGNALS

FIELD OF THE INVENTION

The present invention relates to frequency synthesizers generally and, more particularly, to a fractional synthesis scheme for generating periodic signals.

BACKGROUND OF THE INVENTION

One conventional approach of fractional-N synthesis is called phase interpolation. This approach uses some form of phase interpolation to create fractional cycles from an input reference.

One example of such approach is shown as the circuit 10 in FIG. 1 and uses Direct Digital Synthesis (DDS) in the feedback loop to provide the fractional PLL updates. The circuit 10 generally comprises a phase detector 12, a VCO 14, an adder 16, a digital-to-analog (DAC) converter 18, an accumulator 20 and a divide block 22. The number in the accumulator 20 is always proportional to the phase offset needed to adjust for the fractional divide. The adjustment for the fractional cycle is achieved by converting the digital contents of the accumulator 20 to an analog signal (by the DAC 18) that is added to the output of phase detector 12 by the adder 16. An offset K is continually added to the accumulator 20. On overflow, the modulus of the counter is switched to N+1. If the DAC 18 were not used, a jitter would be created in the output frequency of te accumulator 20, creating spurs related to the update rate of the loop.

The embedded DDS circuit 10 shown in FIG. 1 creates problems because it relies on accurate cancellation of the beat noise introduced by the DDS system. Noise injection at this stage greatly influences jitter since the VCO integrates this noise into frequency presented at the output. Since only full VCO cycles are available, the interpolation has to be achieved by averaging feedback cycles that differ in length. The DAC is used to try to overcome this granularity by canceling the error.

A second way to achieve the phase interpolation is to use single side band mixing. Such an implementation is shown in FIG. 2 as a circuit 30. The circuit 30 generally comprises a phase detector 32, a loop filter 34, a VCO 36, a divider 38, a mixer 40 and a sinusoidal oscillator 42.

The circuit 30 shown in FIG. 2 requires the extra mixer 40 and the sinusoidal oscillator 42. Performance is limited by the mixer 40. Carrier leakage through the mixer 40 will show up in the output spectrum of the loop. If suppression of the other sideband is not good, this also causes problems. The requirement that VCO 36 needs to create a sinusoidal output is a drawback.

Another way of synthesizing frequencies is to use a tapped delay line operating as a delay-locked loop. The taps are used to create a data clock. Such an approach is described in the paper "An Interpolating Clock Synthesizer", IEEE Journal of solid-State Circuits, VOL. 31, NO. 9, published September 1996, which is hereby incorporated by reference in its entirety. Interpolation between taps is used to provide a deskewing function. Using a lookup table ROM, bits can be clocked out with the data clock to create arbitrary waveforms. This is an example of a Direct Digital Synthesis (DDS) system, where the high frequency clock is generated through DLL techniques. This method led to the Interpolating Clock Synthesizer.

The third method is very complex and large in size when frequency is multiplied by large factors. For large factors of frequency multiplication, the ROMs need to be large, and the number of taps in the delay line needs to be large. Also, the jitter at each delay line tap is not significantly better than the jitter of the input reference. At large synthesis values, this leads to clocks that have large jitter compared to the cycle time. It probably works best for synthesis values less than 10.

A fourth way to implement fractional synthesis is to use a pure DDS system. The fourth method requires a high frequency clock to generate the edges for phase interpolation, or a very precise digital to phase converter.

A fifth way to do fractional synthesis is through the use of pulse swallowing techniques using additive jitter or noise shaping to lower the effects of the pattern noise.

SUMMARY OF THE INVENTION

The present invention concerns an apparatus comprising a first circuit, a second circuit and a third circuit. The first circuit may be configured to generate an output signal having a first frequency in response to (i) an input having a second frequency and (ii) a first control signal. The second circuit may be configured to generate the second frequency in response to (i) a plurality of third clock signals and (ii) a second control signal. The third circuit may be configured to present the first and second control signals in response to one of said plurality of third clock signals.

The objects, features and advantages of the present invention include a circuit, method and/or architecture for generating a periodic signal that may provide (i) clean updates to the loop filter, (ii) provide a low phase noise feedback clock and/or (iii) impose a minimum overhead on the PLL.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may generate a frequency that is related to the input frequency by a fractional number. The present invention provides a particular and effective way of implementing fractional N synthesis using phase interpolation.

Figure 1:
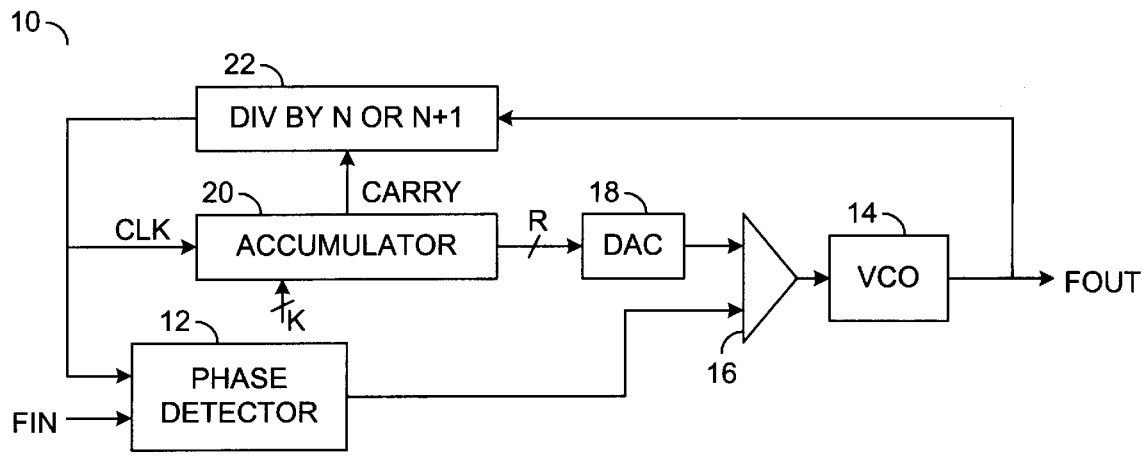
FIG. 1 is a block diagram of a conventional fractional-N synthesizer.
Figure 2:
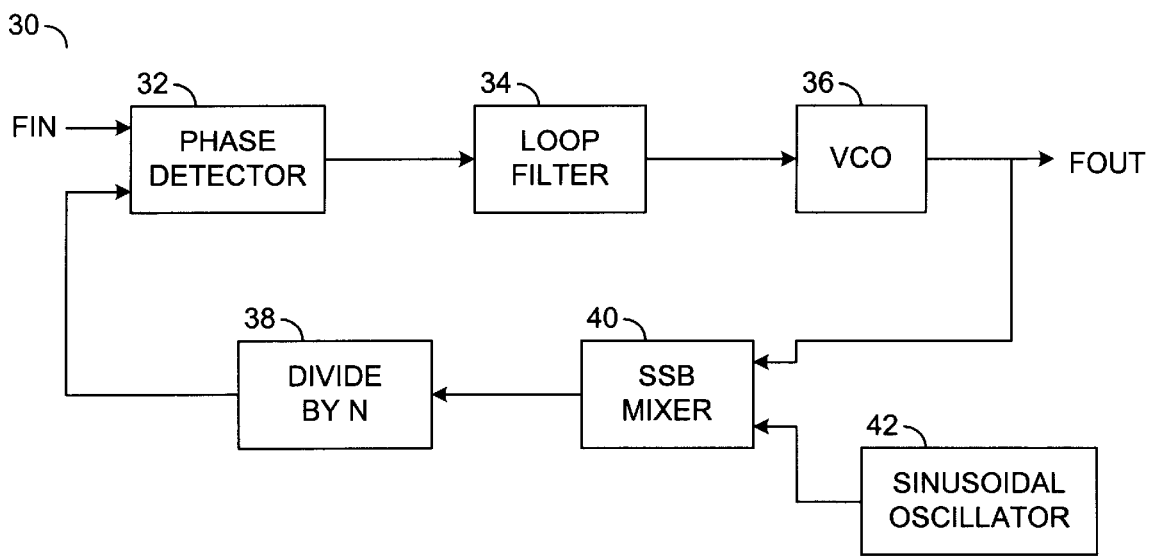
FIG. 2 is another example of a conventional fractional-N synthesizer.
Figure 3:
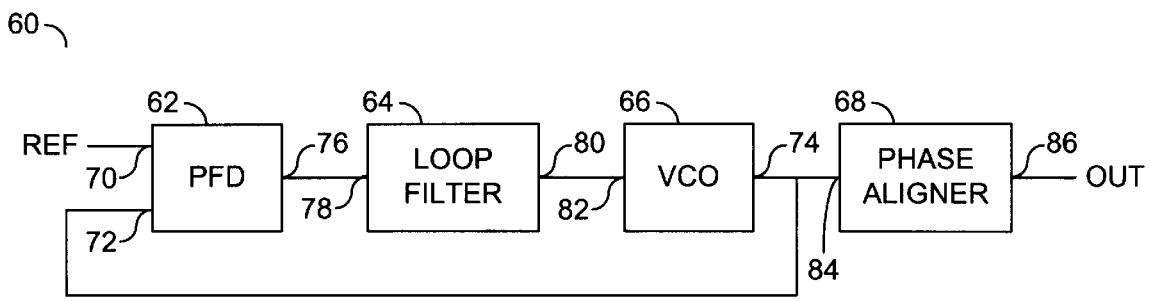
FIG. 3 is a block diagram illustrating a context of a preferred embodiment of the present invention.

Referring to FIG. 3, a block diagram of a circuit 60 is shown illustrating a context for a preferred embodiment of the present invention. The circuit 60 generally comprises a phase frequency detector (PFD) 62, a loop filter 64, a voltage controlled oscillator (VCO) 66 and a phase aligner 68. The PFD 62 generally comprises an input 70 that may receive an input signal (e.g., an input reference signal REF), an input 72 that may receive the signal from an output 74 of the VCO 66 and an output 76 that may present a signal to an input 78 of the loop filter 64. The loop filter 64 may present a signal at an output 80 that may be received at an input 82 of the VCO 66. The signal presented at the output 74 of the VCO 66 may also be presented to an input 84 of the phase aligner 68. The phase aligner 68 may present a signal (e.g., OUT) and an output 86. An example of the circuit shown in FIG. 3 may be found in co-pending application U.S. Ser. No. 09/050,548, which is hereby incorporated by reference in its entirely. In one example, the phase aligner may be controlled by a state machine (not shown) and a phase detector (not shown) to implement a delay-lock loop (DLL) function.

Figure 4:
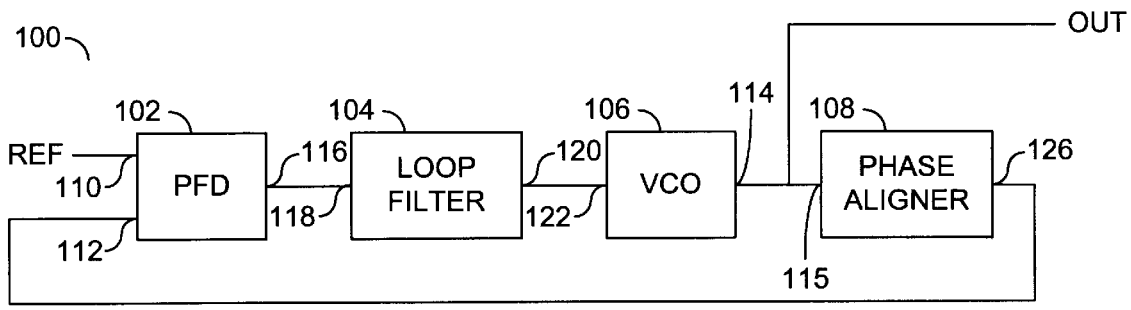
FIG. 4 is a block diagram of a preferred embodiment of the present invention.

Referring to FIG. 4, a circuit 100 is shown illustrating a preferred embodiment of the present invention is shown. The circuit 100 generally comprises a phase frequency detector (PFD) 102, a loop filter 104, a voltage controlled oscillator (VCO) 106 and a phase aligner 108. The PFD 102 generally comprises an input 110 that may receive an input signal (e.g., an input reference signal REF), an input 112 that may receive the signal from an output 126 of the phase aligner 106 and an output 116 that may present a signal to an input 118 of the loop filter 104. The loop filter 104 may present a signal at an output 120 that may be received at an input 122 of the VCO 106. The VCO 114 may present a signal (e.g., OUT) at the output 114 that may be presented to an input 115 of the phase aligner 108. The circuit 100 may be, in one example, a phase-locked loop circuit.

The output signal OUT may have a periodic frequency that may be synthesized by the VCO 114. The resulting frequency of the signal OUT may then be delayed by a phase aligner circuit 108. A state machine (to be described in detail in connection with FIG. 5) may be used to control the delay that is generated by the phase aligner circuit 124. The phase aligner circuit 124 may be used to interpolate a number (e.g., 512) of equally spaced levels of phase offset around one turn of a ring oscillator used internally the VCO 106. The number 512 is an example that may provide adequate granularity of the delay. However, finer or coarser granularity may be implemented according to meet the design criteria of a particular application. Since the ring is fully closed, it is generally possible to wrap around the phase offset and create an apparently infinite amount of delay. The phase frequency detector 102 can be used to drive the phase offset until the reference signal REF and the output signal OUT are aligned.

Rather than creating a DLL circuit, the circuit 100 feeds back the delayed output. The state machine (to be described in detail in connection with FIG. 5) is generally needed to control the delay.

Figure 5:
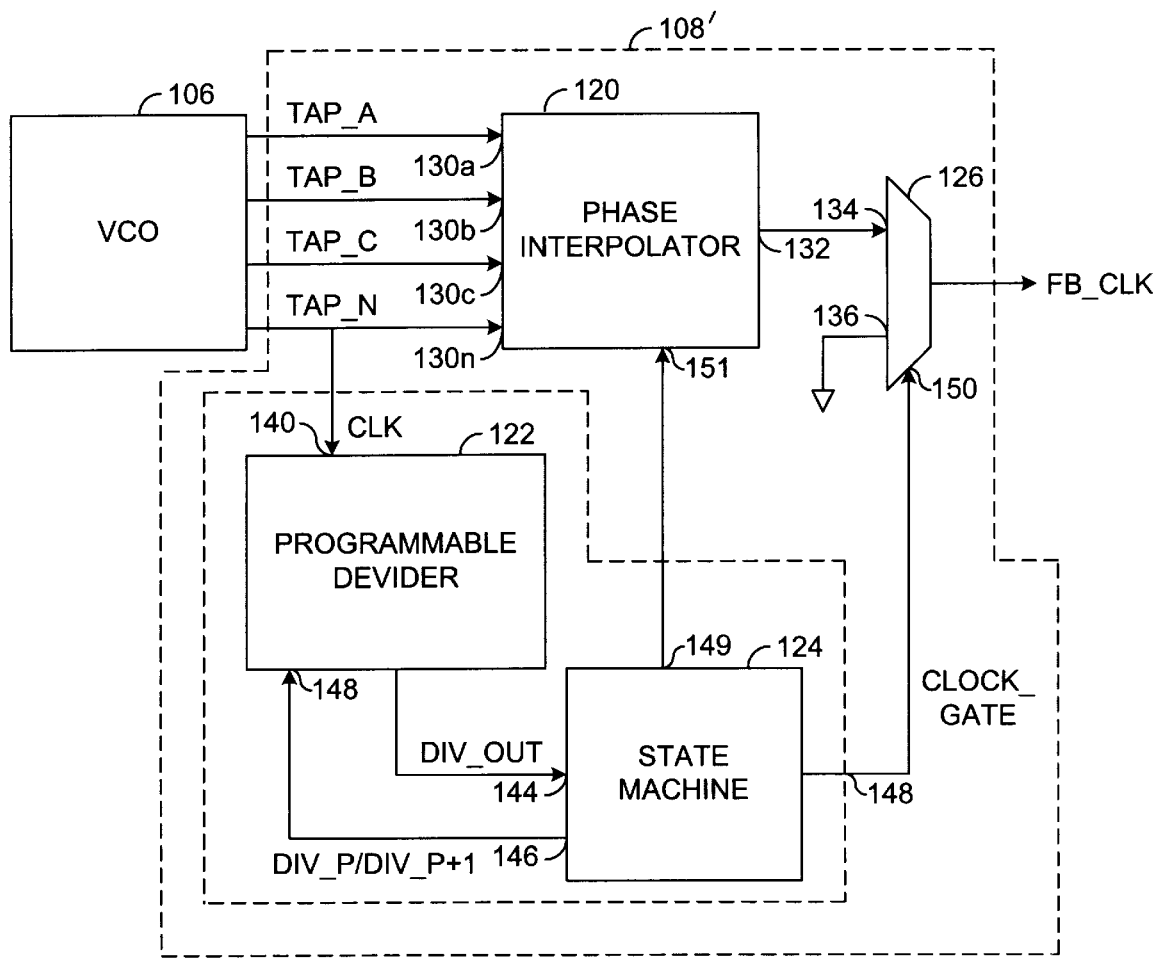
FIG. 5 is a block diagram of the state controller that may be used with the present invention.

Referring to FIG. 5, a more detailed diagram of the phase aligner 108 is shown. The phase aligner 108 generally comprises a phase interpolator 120, a circuit 121 and a multiplexer 126. The circuit 121 generally comprises a programmable divider 122 and a state machine 124. The VCO 106 generally presents a number of signals TAP_A, TAP_B, TAP_C and TAP_N to a number of inputs 130a–130n of the phase interpolator 120. The phase interpolator 120 generally presents a signal at an output 132 that may be received at a first input 134 on the multiplexer 126. A second input 136 of the multiplexer 126 is generally coupled to ground.

The programmable divider 122 generally receives the signal TAP_N at an input 140 that may serve as an absolute reference to the divider 122. The programmable divider generally presents a signal DIV_OUT to an input 144 of the state machine 124. The state machine 124 may also have an output 146 that may present a signal (e.g., DIV_P/DIV_P+1) to an input 148 of the programmable divider 122. The state machine 124 may also have an output 148 that may present signal to an input 150 of the multiplexer 126 and a output 149 that may present a control signal (e.g., PHASE_SETTING) to an input 151 of the phase interpolator 120.

Suppose an example where the frequency of the reference signal REF is to be multiplied by a factor of 10.25. The following method describes the operation of the divider and the phase aligner circuit 108:

(A) Count 10 cycles in the divider and set the phase aligner to 0.25 of a cycle,
(B) Count 10 cycles and set the phase aligner to 0.5 of a cycle,
(C) Count 10 cycles and set the phase aligner to 0.75 of a cycle,
(D) Count 11 cycles,
(E) Repeat from steps A–D.

At each update at the output of the phase aligner 108, 10.25 cycles have generally been delivered to the phase detector 102. The generated frequency of the signal OUT will normally be 10.25 times the frequency of the signal REF.

The example provided may be modified accordingly to meet 20 the design criteria of a particular application. For example, the number 10 may be any number (e.g., J) that may provide a whole number multiple frequency multiplication. The fraction 0.25 may be equal to a number (e.g., K) divided by the product of the number of taps TAP_A–TAP_N (e.g., N) times a fixed number (e.g., M). The numbers J, K, L and M are generally integers. As a result, the following equation illustrates a generic formula for calculating the frequency of oscillation of the signal OUT:

$$OUT = J + K/(N*M) \qquad EQ1$$

Figure 6:
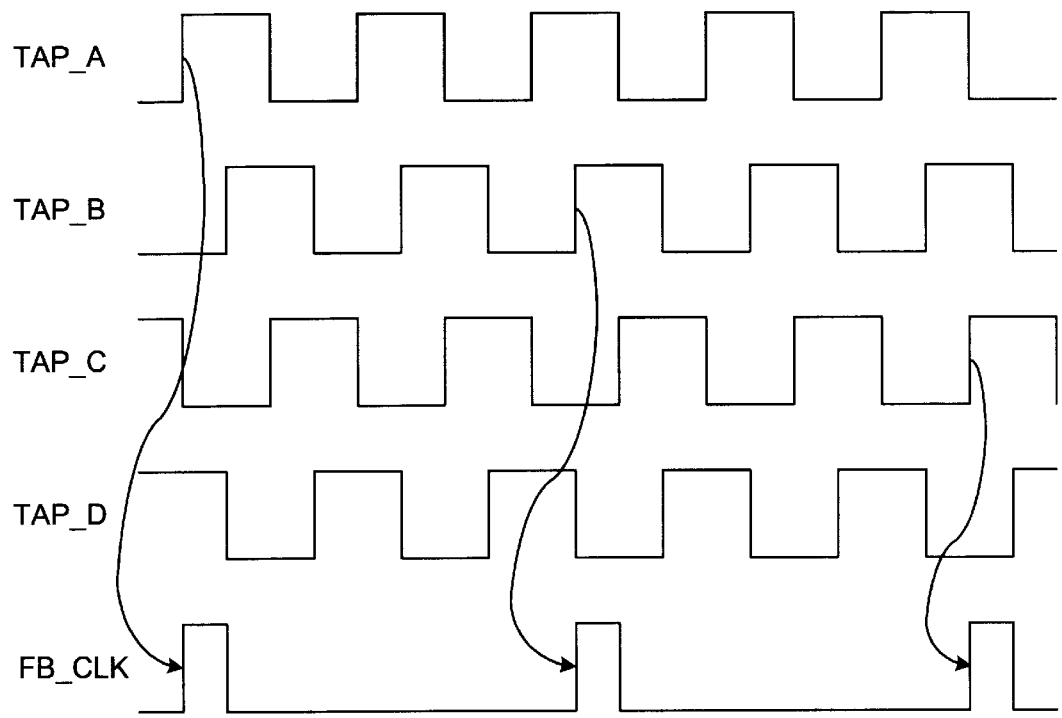
FIG. 6 is a timing diagram illustrating various waveforms of the present invention.

FIG. 6 is a diagram illustrating how the interpolated edges are used to generate the signal FB_CLK with a fraction of 2.25. In an example where VCO 106 has four taps, with each of the taps are shown as TAP_A, TAP_B, TAP_C and TAP_N, the state machine 124 may guide the selection of the proper edges of the tap signals TAP_A–TAP_N to create the signal FB_CLK. The selection is generally represented by the arrows 160, 162 and 164. The duty cycle of the signal FB_CLK is generally balanced since the phase detector 102 in the PLL is generally only looking at one edge per period, not both edges. While FIGS. 5 and 6 are shown having four tap signals TAP_A–TAP_N, more tap signals or less tap signals may be implemented accordingly to meet the design criteria of a particular implementation.

The general logic needed for the implementation of the present invention is the feedback divider 122 and the state machine 124 to guide the method. The state machine 124 may include a counter to count the modulus. The state machine 124 may use an accumulator to track the offset that needs to be added at each cycle of the signal FB_CLK. The state machine 124 may control the phase aligner 108 to perform a Direct Digital Synthesis (DDS) Function.

In general, the four phases of a VCO 106 are fed to the phase interpolator 120. The divider 122 can divide by P or P+1 and is generally controlled by signal received at the input 148 the state machine 124. The state machine 124 may be programmed with P and the fractional value. Based on the number of pulses of the signal DIV_OUT, the state machine 124 may control the phase setting of the interpolator 120 and the signal CLOCK_GATE to generate the signal FB_CLK.

The circuit 100 may generate pure single frequency feedback clock signal FB_CLK. The purity of the signal FB_CLK may be limited by the granularity of phase interpolator 120. This is opposed to conventional circuitry where pulse swallowing is used along with a DDS to create a DAC correction signal adds deviation and jitter that is dependent on the accuracy of the DAC correction.

The circuit 100 creates cleaner updates to the loop filter (inherent in the VCO 106), which may allow more freedom in setting the loop bandwidth. Since there are no spurious tones, the loop filter bandwidth may be maximized to speed settling of the circuit 100.

Interpolating the VCO 106 may provide a low phase noise feedback clock signal FB_CLK. The delay circuits may be integrated with the VCO to provide less noise sensitivity and better tracking of both process and noise. Since dividers typically do not exhibit much additive noise, the VCO 106 and the phase aligner 108 may, for the most part, determine the noise of the signal FB_CLK.

The phase aligner circuit 108 may introduce only a minimal overhead to the circuit 100. In fact the phase aligner 108' and the divider circuit 122 may be conceptually combined to form a fractional divider. All other PLL parameters generally remain the same. All advantages and techniques to exploit the basic PLL architecture may still be applied. For example, existing lock detector circuits, circuits to improve settling time and phase frequency detectors all can be used as before.

The present invention may be useful for frequency synthesis circuit applications. The present invention may also be valuable in RF electronics for generating pure and closely spaced frequencies.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate an output signal having a first frequency in response to (i) an input having a second frequency and (ii) a first control signal;
   a second circuit configured to generate said second frequency in response to (i) a plurality of third clock signals and (ii) a second control signal; and
   a third circuit configured to present said first and second control signals in response to one of said plurality of third clock signals.

2. The apparatus according to claim 1, wherein said third circuit comprises a state machine configured to generate said first and second control signals.

3. The apparatus according to claim 2, wherein said third circuit further comprises a programmable divider configured to present a third signal to the state machine.

4. The apparatus according to claim 3, wherein said third control signal is generated in response to a fourth control signal received from said state machine and said second control signal.

5. The apparatus according to claim 1, wherein said first circuit comprises a multiplexer.

6. The apparatus according to claim 5, wherein said multiplexer presents said output signal in response to (i) said input having said second frequency, (ii) a second input coupled to ground and (iii) said first control signal.

7. The apparatus according to claim 1, wherein said apparatus is used to control a phase-locked loop circuit.

8. An apparatus comprising:
   means for generating an output signal having a first frequency in response to (i) an input having a second frequency and (ii) a first control signal;
   means for generating said second frequency in response to (i) a plurality of third clock signals and (ii) a second control signal; and
   means for generating said first and second control signals in response to one of said plurality of third clock signals.

9. A method for generating a clock signal comprising:
   (A) generating said clock signal having a first frequency in response to (i) an input having a second frequency and (ii) a first control signal;
   (B) generating said second frequency in response to (i) a plurality of third clock signals and (ii) a second control signal; and
   (C) generating said first and second control signals in response to one of said plurality of third clock signals.

10. The method according to claim 9, wherein step (C) generates said first and second control signals using a state machine.

11. The method according to claim 10, further comprising the sub-step of:
   presenting a third signal to the state machine.

12. The method according to claim 11, wherein said third control signal is generated in response to a fourth control signal received from said state machine and said second control signal.

13. The apparatus according to claim 9, wherein step (A) further comprises the sub-step of:
   presenting said clock signal in response to (i) said input having said second frequency, (ii) a second input coupled to ground and (iii) said first control signal.

14. The method according to claim 9, wherein said method is used to control a phase-locked loop.

* * * * *